(12) United States Patent
Rashev et al.

(10) Patent No.: US 8,306,488 B2
(45) Date of Patent: *Nov. 6, 2012

(54) SIGNAL TRANSMITTER LINEARIZATION

(75) Inventors: Peter Zahariev Rashev, Calgary (CA); John-Peter van Zelm, Calgary (CA); David M. Tholl, Calgary (CA)

(73) Assignee: Apple Inc., Cupertino, CA (US)

( * ) Notice: Subject to any disclaimer, the term of this patent is extended or adjusted under 35 U.S.C. 154(b) by 127 days.

This patent is subject to a terminal disclaimer.

(21) Appl. No.: 12/858,998

(22) Filed: Aug. 18, 2010

(65) Prior Publication Data

US 2010/0311361 A1 Dec. 9, 2010

Related U.S. Application Data

(63) Continuation of application No. 11/689,374, filed on Mar. 21, 2007, now Pat. No. 7,796,960.

(51) Int. Cl.
*H04B 1/04* (2006.01)
*H04B 1/02* (2006.01)

(52) U.S. Cl. ............ 455/114.3; 455/115.1; 455/91

(58) Field of Classification Search ............ 455/91, 455/114.3, 115.1, 114.2, 115.3, 115.4; 375/296, 375/297
See application file for complete search history.

(56) References Cited

U.S. PATENT DOCUMENTS

| | | | |
|---|---|---|---|
| 3,767,900 A | 10/1973 | Chao et al. | |
| 4,577,334 A | 3/1986 | Boer et al. | |
| 4,578,747 A | 3/1986 | Hideg et al. | |
| 4,717,894 A | 1/1988 | Edwards et al. | |
| 5,049,832 A | 9/1991 | Cavers | |
| 5,113,414 A | 5/1992 | Karam et al. | |
| 5,119,399 A | 6/1992 | Santos et al. | |
| 5,371,481 A | 12/1994 | Tiittanen et al. | |
| 5,524,285 A | 6/1996 | Wray et al. | |
| 5,613,226 A | 3/1997 | Kanami | |
| 5,647,023 A | 7/1997 | Agazzi et al. | |
| 5,732,333 A | 3/1998 | Cox et al. | |
| 5,740,520 A | 4/1998 | Cyze et al. | |
| 5,745,597 A | 4/1998 | Agazzi et al. | |
| 5,786,728 A | 7/1998 | Alinikula | |
| 5,923,712 A | 7/1999 | Leyendecker et al. | |
| 5,990,738 A | 11/1999 | Wright et al. | |
| 6,128,541 A | 10/2000 | Junk | |
| 6,133,789 A | 10/2000 | Braithwaite | |
| 6,147,553 A | 11/2000 | Kolanek | |
| 6,169,463 B1 | 1/2001 | Mohindra et al. | |
| 6,194,964 B1 | 2/2001 | Jun | |
| 6,208,698 B1 | 3/2001 | Marchesani et al. | |
| 6,266,517 B1 | 7/2001 | Fitzpatrick et al. | |
| 6,275,685 B1 | 8/2001 | Wessel et al. | |

(Continued)

OTHER PUBLICATIONS

"U.S. Appl. No. 11/693,512 Final Office Action Mailed Dec. 9, 2009", 23 pgs.

(Continued)

*Primary Examiner* — Sonny Trinh
(74) *Attorney, Agent, or Firm* — Meyertons, Hood, Kivlin, Kowert & Goetzel, P.C.

(57) ABSTRACT

A linearizer for a non-linear transmitter includes a tap delay line that provides samples of an input signal at selected times. At least one Volterra tap is coupled to the tape delay line. The Volterra tap includes a lookup table representation of a polynomial. An adaptive controller is coupled to the Volterra tap for modifying values in the lookup table.

20 Claims, 5 Drawing Sheets

U.S. PATENT DOCUMENTS

| | | | |
|---|---|---|---|
| 6,298,096 | B1 | 10/2001 | Burgin |
| 6,342,810 | B1 | 1/2002 | Wright et al. |
| 6,687,235 | B1 | 2/2004 | Chu |
| 7,085,330 | B1 | 8/2006 | Shirali |
| 7,551,668 | B2 | 6/2009 | Higashino et al. |
| 7,729,446 | B2* | 6/2010 | Copeland ............ 375/297 |
| 7,773,692 | B2* | 8/2010 | Copeland et al. ........ 375/297 |
| 7,822,146 | B2* | 10/2010 | Copeland ............ 375/296 |
| 2001/0022532 | A1 | 9/2001 | Dolman |
| 2002/0123869 | A1 | 9/2002 | Koppl et al. |
| 2002/0181611 | A1 | 12/2002 | Kim |
| 2003/0146791 | A1 | 8/2003 | Shvarts et al. |
| 2004/0198268 | A1 | 10/2004 | Rashev et al. |
| 2007/0036211 | A1 | 2/2007 | Kajiwara |
| 2008/0152037 | A1 | 6/2008 | Kim et al. |
| 2010/0183106 | A1* | 7/2010 | Beidas et al. ............ 375/350 |

OTHER PUBLICATIONS

"U.S. Appl. No. 11/689,374, Non-Final Office Action mailed Nov. 2, 2009", 9 pgs.

"U.S. Appl. No. 11/689,374, Notice of Allowance mailed May 4, 2010", 7 pgs.

"U.S. Appl. No. 11/689,374, Response filed Feb. 2, 2010 to Non Final Office Action mailed Nov. 2, 2009", 9 pgs.

"U.S. Appl. No. 11/693,512, Response Filed Feb. 27, 2009 to Restriction Requirement Received on Jan. 13, 2009.", 6 pgs.

"U.S. Appl. No. 11/693,512, Final Office Action mailed Mar. 11, 2010", 27 pgs.

"U.S. Appl. No. 11/693,512, Non Final Office Action mailed Jun. 1, 2009", 20 pgs.

"U.S. Appl. No. 11/693,512, Response filed Feb. 9, 2010 to Final Office Action mailed Dec. 9, 2009", 10 pgs.

"U.S. Appl. No. 11/693,512, Response filed Aug. 11, 2010 to Final Office Action mailed Mar. 11, 2010", 8 pgs.

"U.S. Appl. No. 11/693,512, Response filed Sep. 1, 2009 to Non Final Office Action mailed Jun. 1, 2009", 10 pgs.

"U.S. Appl. No. 11/693,512, Restriction Requirement mailed Jan. 13, 2009", 7 pgs.

Faulkner, M., et al., "Amplifier Linearisation Using RF Feedback and Feedforward Techniques", Proceedings of the IEEE Vehicular Technology Conference, Chicago, IL, (Jul. 25, 1995), 525-529.

Jones, A. E, et al., "Phase error correcting vector modulator for personal communications network(PCN) transceivers", Electronics Letters, 27(14), (Jul. 4, 1991), 1230-1231.

Lohtia, A., et al., "Power Amplifier Linearization Using Cubic Spline Interpolation", IEEE Vehicular Technology Conference, (May 18-20, 1993), 676-679.

Sano, A., et al., "Identification of Hammerstein-Wiener System with Application to Compensation for Nonlinear Distortion", SICE 2002; Proceedings of the 41st SICE Annual Conference; vol. 3, (Aug. 5-7, 2002), 1521-1526.

"U.S. Appl. No. 11/693,512, Appeal Brief filed Apr. 28, 2011", 20 pgs.

"U.S. Appl. No. 11/693,512, Examiner's Answer to Appeal Brief mailed May 26, 2011", 21 pgs.

"U.S. Appl. No. 11/693,512, Final Office Action mailed Oct. 28, 2010", 22 pgs.

* cited by examiner

SIGNAL TRANSMITTER LINEARIZATION

RELATED APPLICATION

This application is a continuation of and claims the benefit of priority under 35 U.S.C. 120 to U.S. patent application Ser. No. 11/689,374 (entitled Signal Transmitter Linearization, filed Mar. 21, 2007) which claims the benefit of priority under 35 U.S.C. 119(e) of U.S. Provisional Application Ser. No. 60/788,970 (entitled Adaptive Look-Up Based Volterra-series Linearization of Signal Transmitters, filed Apr. 4, 2006) the benefit of priority of each of which is claimed hereby, and each of which are incorporated by reference herein in its entirety.

BACKGROUND

Radio transmitters amplify input signals. It is desired that the gain of such transmitters be linear for the entire range of input signals. Memoryless linearization of signal transmitters and, in particular, of radio transmitters is closely related to the problem of power amplifier linearization using baseband techniques, which is considered to be of the greatest significance for achieving effective and economical minimization of transmission-related signal distortions in digital communication systems.

Despite a big diversity of existing approaches aimed at improving the quality of RF power amplification, many of the older solutions are constrained to usage with specific discrete-level signaling formats, and, thus have a limited relevance to contemporary wideband communication standards. Development of general solutions of a particular practical value that are invariant with respect to the transmitted signal has been simulated in the past decade, pointing out the usefulness of a single-argument complex gain function of the input power for the modeling of memoryless distortions in baseband power amplifier linearizers.

Compared to the previously demonstrated general approach using two-dimensional mapping of the amplifier output against the phase and magnitude signal values at its input, the gain-based nonlinear model has a substantially lower computational complexity for the same performance that is instrumental in the design of hardware-efficient digital linearization systems.

A common architecture of recently proposed baseband power amplifier linearizers includes a digital nonlinear gain block, usually called a predistortion block, inserted in the transmitter chain prior to upconversion stages. The predistortion block may be continuously adapted to approximate as closely as possible the inverse nonlinear complex gain of the following transmitter stages up to the power amplifier. Depending on the coordinate system in which the transmitter gain estimation is conducted, two main types of baseband linearization approaches can be distinguished: (1) orthogonal-coordinate, where the complex gain function is defined by a pair of real and imaginary functions, and (2) polar-coordinate, where the complex gain function is defined by a magnitude and a phase function. Since in Quadrature Amplitude Modulation (QAM) schemes the signals are typically represented by in-phase and quadrature-phase components, i.e. in orthogonal coordinates, the realization of the second approach involves additional complexity to provide for coordinate system transformation of the estimation data. On the other hand, more sophisticated predistorter architectures and adaptation algorithms may be required for the implementation of unconditionally convergent and robust baseband linearization in orthogonal coordinates to account for high-power memory effects as a function of the input signal bandwidth and dynamic-range.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein are implemented in software or a combination of software and human implemented procedures in one embodiment. The software may consist of computer executable instructions stored on computer readable media such as memory or other type of storage devices. The term "computer readable media" is also used to represent any means by which the computer readable instructions may be received by the computer, such as by different forms of wireless transmissions. Further, such functions correspond to modules, which are software, hardware, firmware or any combination thereof. Multiple functions are performed in one or more modules as desired, and the embodiments described are merely examples. The software may be executed on a FPGA, ASIC, digital signal processor, microprocessor, or other type of processor operating on a computer system, such as a personal computer, server or other computer system.

Linearization of signal transmitters with memory effects is performed by an adaptive control system using inverse Volterra-series modeling. The signal transmitter may be a baseband transmitter for cellular communications implementing various protocols, such as CDMA, UMTS and WiMAX as well as others. A modular architecture is described for a linearizer and an associated controller allowing higher order Volterra approximation terms to be added with minimal impact on complexity. A system utilizes a novel representation of the Volterra-series polynomials which is compatible with an efficient look-up table (LUT) implementation, such as in digital hardware. Compared to existing approaches, the disclosed method and system may provide improved performance by realizing a larger number of higher order Volterra terms for the same processing complexity, structural flexibility of the inverse model by software re-configurability of the Volterra terms order, and implementation efficiency by utilizing uniform sets of dual-port RAMs used as LUTs to modify and accumulate processing elements to implement Volterra terms.

Figure 1:
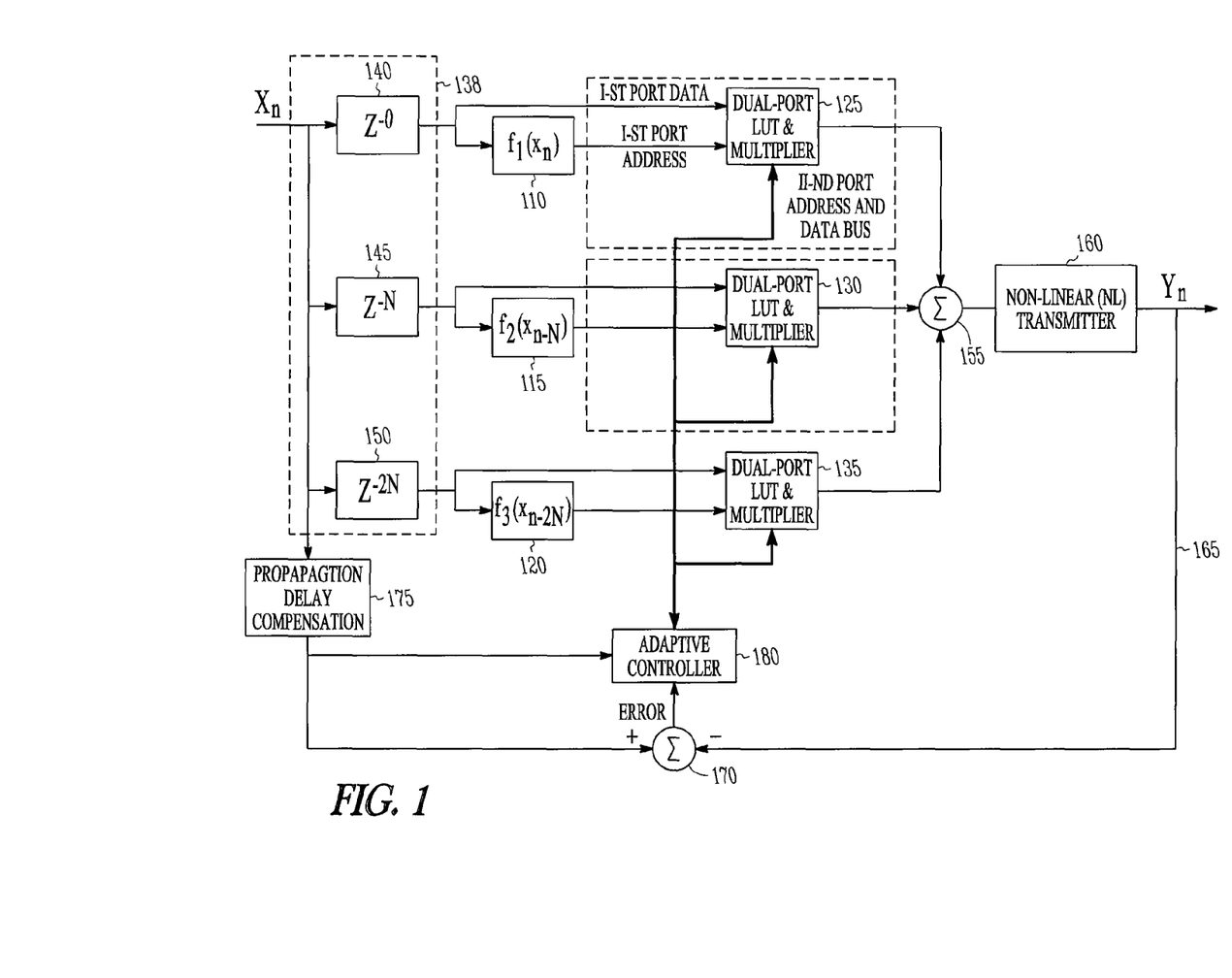
FIG. 1 is a block diagram of a look up table based Volterra-series linearizer with main terms according to an example embodiment.

A LUT-based Volterra-series linearizer 100 can implement arbitrary order Main Terms of the Volterra-series expansion as shown in FIG. 1. An array of complex multipliers 110, 115, 120 is connected to a set of real and imaginary dual-port LUT pairs encapsulated in the "Dual-port LUT & Multiplier" functional blocks 125, 130, 135 (referred to shortly here as Volterra taps) as well as a tap-delay line 138 composed of an array of $Z^{-n}$ delay elements 140, 145, 150 with tap-spacing of N samples amongst, where n is a discrete time index and $Z^{-n}$ designates a propagation delay of n discrete samples. Address inputs of the LUT's are also connected to the delay line via single-port LUT's realized as single-port ROM's in one embodiment and performing functional mapping $f_i(\ )$ (i=1, 2, 3, 4 . . . ), such as, but not limited to, magnitude calculation of delayed input samples $x_n$. The delay line provides for changing the functions temporally. In other words, a function for a present sample may be changed based on future samples. The delay elements form a time axis of the Voltera series. The time axis contains a history of the evolution of the waveform such that different polynomials may be applied across time.

In one embodiment, Volterra tap 125 is a main Volterra tap at time offset 0, corresponding to present time. Volterra tap 130 is a main Volterra tap at time offset −N or N samples before the present time.

The outputs of all multipliers are added together at summation block 155 to provide a predistorted version of the input sample that is provided to a non-linear (NL) transmitter 160. This signal as well as $x_n$ and $y_n$ (an output signal from transmitter 160) may be digital waveforms or digitized versions of analog waveforms undergone analog-to-digital conversion (i.e. $y_n$). The NL transmitter 160 may include digital-to-analog conversion, modulation, frequency translation, filtering or power amplification subsystems and utilize a linear feedback receiver to provide digitized samples on line 165 for error formation at an error bock 170 at a given point or points of the transmitter line-up.

Error block 170 also receives the input signal with propagation delay compensation provided by block 175 to produce an error signal from a comparison of the output signal to the input signal. An obvious sampling point of output signal $y_n$ is the power amplifier output at 165, which may be provided by a directional coupler or other means. The error signal is provided to a set of tap controllers or adaptive controller 180. Adaptive controller 180 is described in further detail with reference to FIG. 3. An adaptive function of each controller in adaptive controller 180 can realize sample-by-sample LUT value optimization.

The linear tap-delay line 138 represents an innovative look at the classic Volterra series definition using sets of non-linear (a.k.a. "polynomial") filters. Polynomial filters may be difficult to implement since the signal samples have to be raised to power before being passed through a tap-delay line and weighed prior to summation. The structure described in FIG. 1 offers functionally equivalent results without the need of power functions or polynomials enabling practical Volterra-series implementations.

Figure 2:
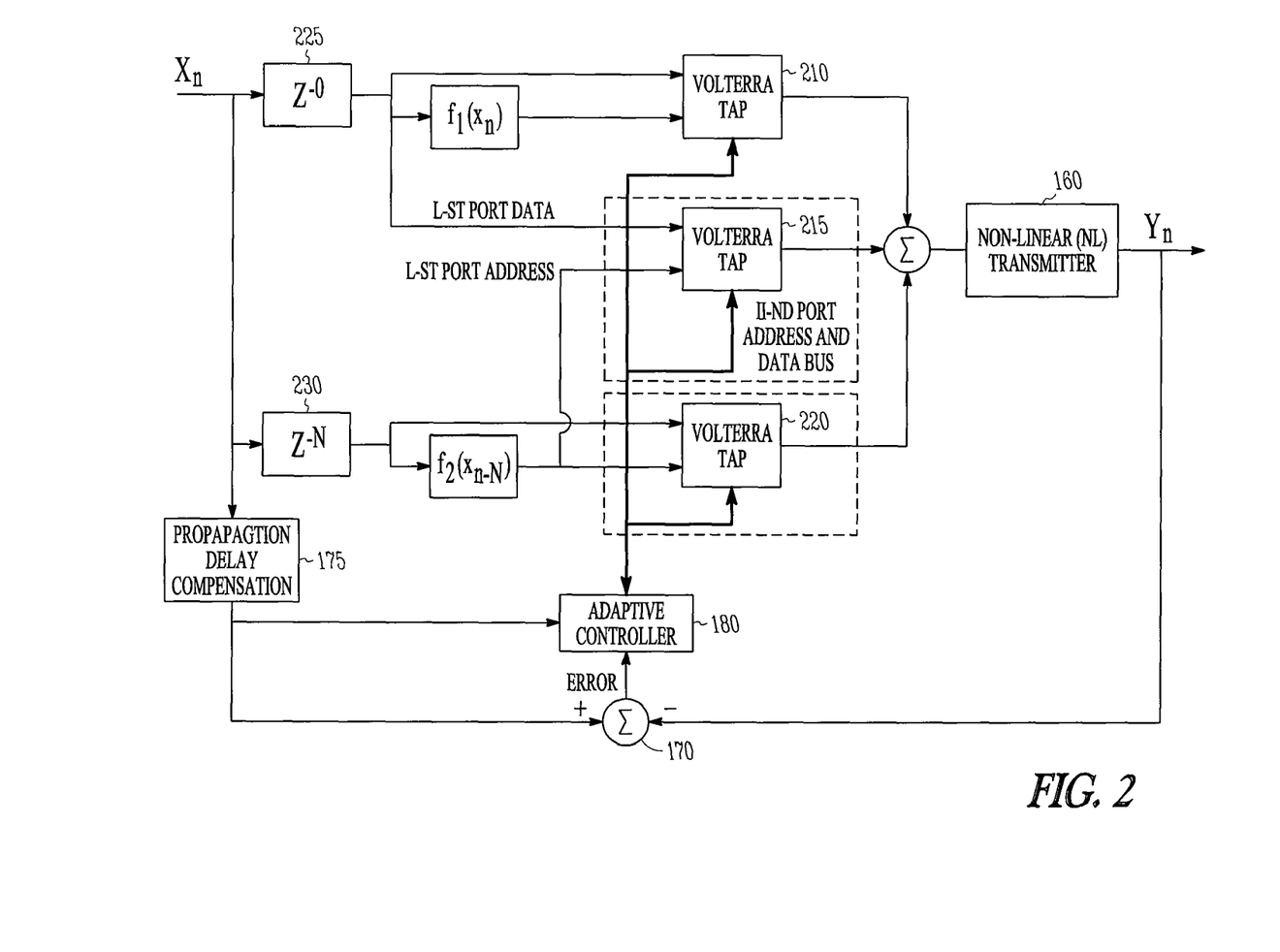
FIG. 2 is a block diagram of a look up table based Volterra-series linearizer with main X-terms according to an example embodiment.

Main X-Terms can be created as shown in FIG. 2 by connecting the Volterra tap inputs 210, 215, 220 to different outputs from the tap-delay line 225, 230. They can also be defined for any combination of past and earlier signal sample (s). Volterra tap input 215 is a Time 0 Main X-TermVolterra tap at time offset −N (N samples before the present time). Volterra tap input 220 is a Main Volterra Tap at time offset −N (N samples before the present time). Time 0 Main X-Term means that the X-Term predistorts input samples at time offset 0 (i.e. present ones), element 225. Time −1 Main X-Term would mean that input samples at time offset −1*N were predistorted, i.e. the I-st port data would come through the $Z^{-N}$ delay element 230.

Secondary X-Terms (of higher order and potentially smaller significance) can be created by adding single-input LUT's performing power functions in the data paths from the delay line to the complex multipliers while forcing $f_i(\ )$ to be power functions. Since the order and complexity of such terms increases exponentially, this definition has no intent to be comprehensive but only exemplary.

Figure 3:
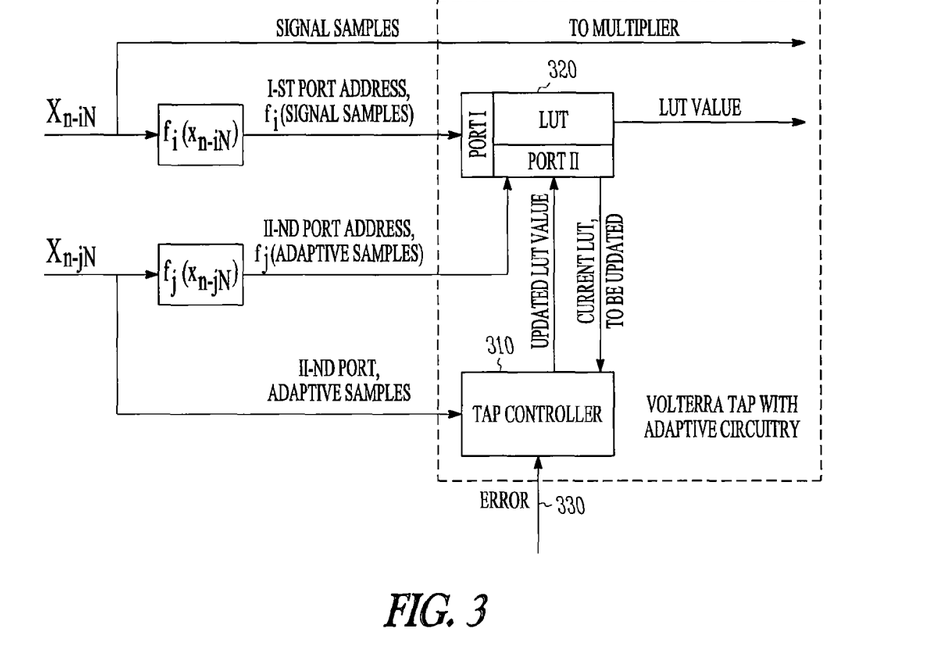
FIG. 3 is a block diagram of an adaptive circuit for a look up table based Volterra-series linearizer according to an example embodiment.

The adaptive controller 180, as shown in further detail in FIG. 3, is composed of a set of adaptive Tap Controllers 310, one for each Volterra Tap which is connected to the second port of the LUT's 320. The adaptive function of each controller 310 can realize LMS, RLS or other sample-by-sample LUT value optimization method.

The error signal 330 from error block 170 is common for all controllers. The adaptive signals $x_{n-iN-D}$ and $x_{n-jN-D}$, used respectively to process/normalize the error signal prior to LUT update and to select the location of the update, are created by passing the input signal (with accounted closed-loop system propagation delay, D) through an adaptation tap-delay line similar to the one defined earlier. A tap controller 310 modifies a LUT Volterra tap 320 value by: (1) reading its current value, (2) modifying it with a processed error, and (3) writing the new value to the same LUT location. For example an LMS update operation can be described as:

$$Y_i^k = Y_i^{k-1} + \mu_i \cdot err_i^{norm}$$

where $Y^{k-1}_i$ is the existing LUT contents of tap i at the discrete time instant n; the real-valued parameter $\mu_i$ is the "adaptation step" which may be different for each tap; and $err_i^{norm}$ is a version of the common complex-valued Error signal which is phase- and magnitude-normalized differently for each tap.

The address information about the location may be derived from the same adaptive tap-delay line. The Main Terms and X-Terms adaptation differs only in the choice of LUT location (i.e. updated LUT address). For j=i, Main Terms are adapted, otherwise Main X-Terms are adapted.

Figure 4:
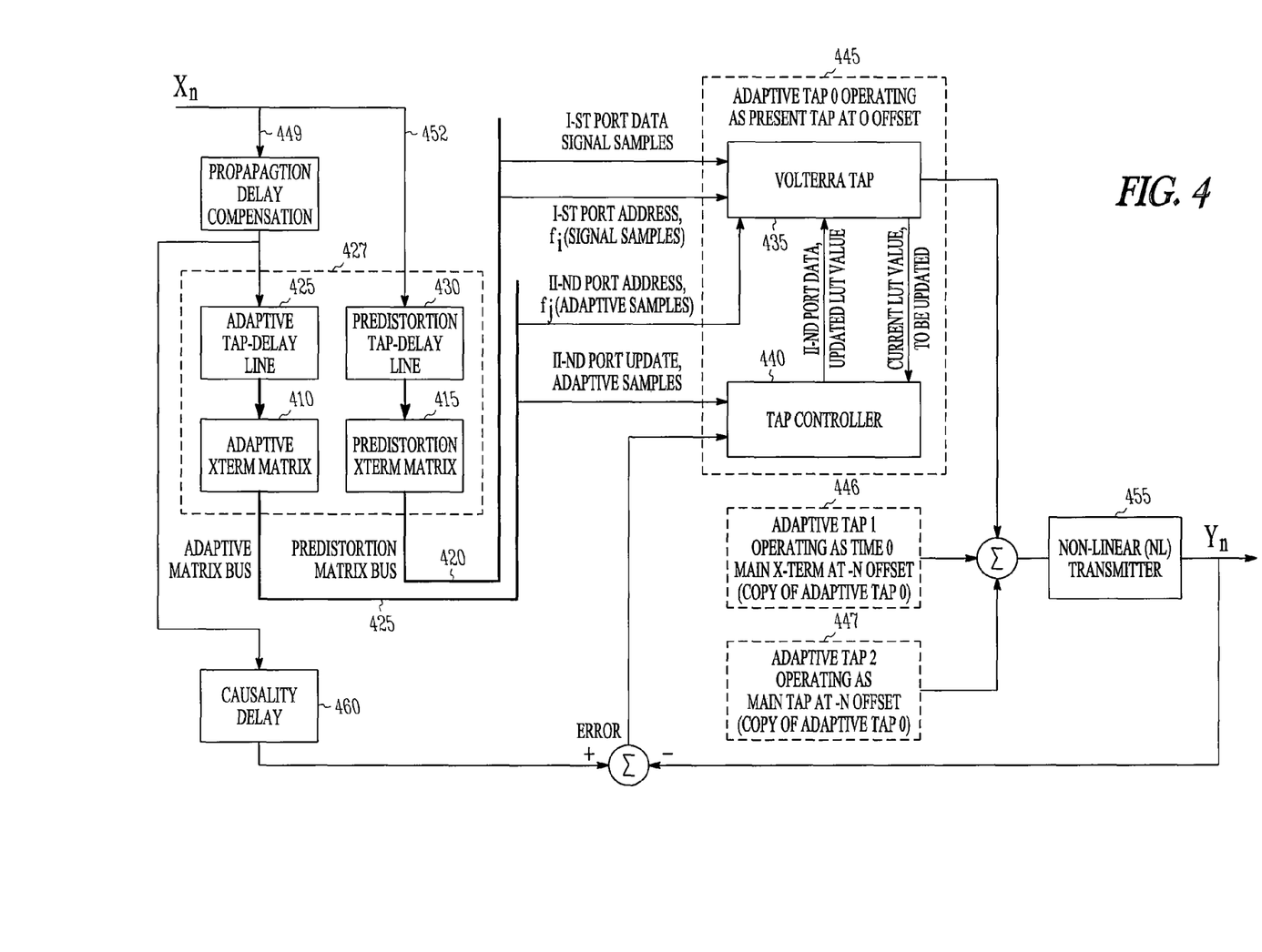
FIG. 4 is a block diagram of a look up table based Volterra-series linearizer with an X-term matrix according to an example embodiment.

The Main Terms and Main X-Terms differ only by which tap-delay line outputs are connected to the I-st Volterra tap ports (see FIGS. 1 and 2), or to the corresponding Tap Controllers (see FIG. 3). It is natural to add two similar synchronously programmed XTerm Matrices 410, 415 in the predistortion 420 and adaptation 425 signal paths in order to increase a given model's linearization power as seen in FIG. 4. The adaptive tap-delay line elements 425, 410 and the predistortion tap delay line 430 and predistortion XTerm matrix 415 together are called the Tap-Delay Line Matrix 427. This matrix includes the mapping function f( ) and means to cross-switch tap-delay line 425, 430 inputs to respective Volterra Taps 435 and Tap Controller 440 pairs. Such a structure can change during operation (e.g. tracking) or system configuration stages. Also, the sets of a Volterra tap 435 and its Tap Controller 440 can be grouped in a generic unit, named Adaptive Tap 445, which can be configured through the XTerm Matrix section of the Tap-Delay Line Matrix to implement main terms or x-terms in the Volterra series expansion of the linearizer. Additional adaptive taps 446 and 447 may be provided in further embodiments. More adaptive taps, such as 7 additional taps provide 8 inputs. The ability to include additional taps provides a modular design. No additional adaptive taps are used in yet further embodiments.

The input signal, $x_n$, follows two different paths in FIG. 4. A first path 449 includes a propagation delay compensation block 450, which along with adaptive tap delay line 425 provides a delayed version of the input signal. A second path 452 provides the actual signal for transmission through the transmitter 455 in real time.

Volterra tap 435 has two ports. A first port receives and processes the real time signals. A second port does not disturb the first port input, but operates to update the contents of the lookup table. The update may be formed as a function of future values of the input signal in various embodiments.

Performance can be maximized through configuration of the Tap Delay Line Matrix so as to implement only Volterra Taps of highest significance.

Figure 5:
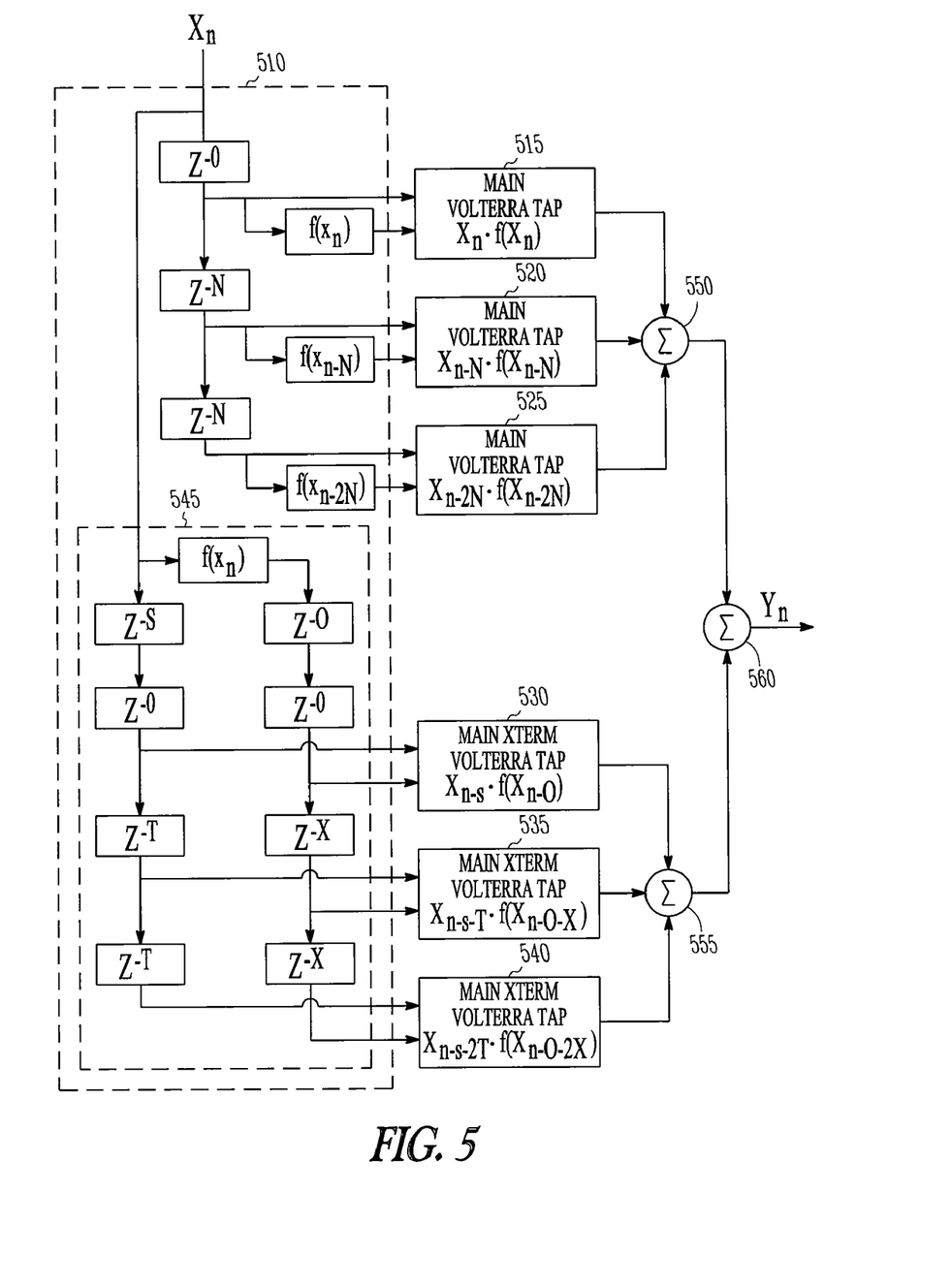
FIG. 5 is a block diagram of a predistortion tap delay line matrix according to an example embodiment.

One example implementation of the predistortion section of a Tap-delay Line Matrix 510 is shown in FIG. 5 (the adaptive matrix may be identical). Through configuration of the tap and sample spacing N, time consecutive Main Volterra Taps 515, 520, 525 may be implemented of the form $X_n[n-kN] \cdot f(X_n[n-kN])$, where 'k' corresponds to the Main Term Tap number. Configuration of time offsets S and O, and sample spacing T and X, allows implementation of consecutive XTerm Volterra Taps 530, 535, 540 of the form $X_n[n-S-kT] \cdot f(X_n[n-O-kX])$, where 'k' corresponds to the XTerm Tap number. An example XTerm matrix is shown at 545. The Main Volterra Taps are summed at 550, the Main XTerm Volterra Taps are summed at 555, and all are summed at 560.

FIG. 5 is one example implementation of the Tap-delay Line Matrix. Alternate implementations include, but are not limited to, transposed type structures where the matrix is distributed across the Tap inputs, outputs and summers. The summers then take the form of pipelined adders rather than adder trees.

Matching of the signal bandwidth to the inverse Volterra model bandwidth is allowed by changing the tap-delay line spacing N for Main Terms and X for X-Terms and implementing a fractionally spaced non-linear equalizer. Programming of the tap spacing can be done empirically during operation or configuration stages.

Adding an extra delay to the error path, causality delay 460 allows shifting of the location of the present tap by a desired number of samples back in time and virtually creating non-causal inverse models which work on past, present and future samples.

Various embodiments of the LUT-based Volterra-series linearizer provides an efficient modular design of the Volterra terms and their adaptive circuits without the need for power functions and polynomials. Use of a pair of dual-port LUTs and a complex multiplier to implement a Volterra term of arbitrary power at a given time offset is referred to as a Volterra tap. Each LUT pair can be independently attached to an adaptive block (e.g. LMS, RLS, etc.). An extendable flexible structure is provided. A change of memory span may be performed by addition or removal of a time-offset block and a Volterra tap. Main Terms and Main X-Terms may be equally extendable as only the signal addressing the LUTs in Volterra taps has to change.

Causality and anti-causality can be enforced or allowed by appropriately delaying the error signal input to the adaptive circuits. Further embodiments of LUT-based Volterra-series linearizers have an upgradeable distributed structure (enabled by modular design). Local change of the adaptive circuit attached to a LUT may result in a new optimization algorithm. Operation of the adaptive block may be transparent for sequential, parallel or semi-parallel adaptation scheme of the Volterra model, while preserving the main properties of prior predistortion methods.

In one embodiment, no coordinate system or format transformations of the input signals for implementation of the control algorithms need be performed. Further, division operations involving the input, feedback or error signals need not be performed. Some embodiments provide a reduced dependence on the statistics of the input signal. Special calibration or tuning sequences before or during transmission may also be avoided in various embodiments.

The adaptive control system described may be applied to improve the performance, efficiency and size of signal transmitters in different fields such as, but not limited to, RF transmission, Hi-Fi audio, Hi-Fi video, optical transmission and, generally, in systems where high-quality of electrical/electro-mechanical/electro-optical/electro-magnetic signal transformation is desired.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. A linearized transmitter, comprising:
   a tap delay line operable to provide samples of an input signal at selected times;
   multiple Volterra taps coupled to the tap delay line, each Volterra tap comprising a lookup table representation of a polynomial; and
   an adaptive controller coupled to the Volterra tap operable to add outputs from the Volterra taps and to modify values in the lookup table to provide a predistorted version of the input sample; and
   a non-linear amplifier coupled to the adaptive controller and operable to amplify the predistorted version of the input sample to provide an amplified and linearized output.

2. A transmitter as defined in claim 1, wherein the tap delay line comprises an array of delay elements with tap-spacing of N samples.

3. A transmitter as defined in claim 1, wherein the tap delay line comprises elements distributed across the Volterra tap inputs and outputs.

4. A transmitter as defined in claim 1, further comprising an error module coupled to an output of the non-linear amplifier and a delay compensated input signal, the error module being operable to provide an error signal to the adaptive controller.

5. A transmitter as defined in claim 4, further comprising a causality delay module operable to shift the location of the present tap by a desired number of samples back in time and virtually create non-causal inverse models which work on past, present and future input samples.

6. A transmitter as defined in claim 5, wherein the adaptive controller is operable to provide a sample-by-sample lookup table value optimization.

7. A transmitter as defined in claim 6, wherein the adaptive controller is operable to modify a lookup table Volterra tap location value by reading its current value, modifying it with a processed error, and writing the new value to the same lookup table location.

8. A transmitter as defined in claim 1, wherein main X-terms can be created by connecting Volterra tap inputs to different outputs from the tap-delay line.

9. A transmitter as defined in claim 1, wherein the tap delay line is operable to hold a history of the evolution of the input such that different polynomials may be applied across time.

10. A transmitter as defined in claim 1, wherein the adaptive controller is operable to use at least two Volterra taps for a sample to provide main X-terms for the sample.

11. A method of linearizing a transmitter, comprising:
applying an input signal to a tap delay line to provide samples of the input signal at selected times;
coupling multiple Volterra taps to the tap delay line, each Volterra tap comprising a lookup table representation of a polynomial; and
adding outputs from the Volterra taps and modifying values in the lookup table to provide a predistorted version of the input sample; and
applying the predistorted version of the input signal to a non-linear amplifier to amplify the predistorted version of the input sample to provide an amplified and linearized output.

12. A method as defined in claim 11, wherein the tap delay line comprises an array of delay elements with tap-spacing of N samples.

13. A method as defined in claim 11, wherein the tap delay line comprises elements distributed across the Volterra tap inputs and outputs.

14. A method as defined in claim 11, further comprising comparing an output of the non-linear amplifier and a delay compensated input signal to provide an error signal to the adaptive controller.

15. A method as defined in claim 14, further comprising shifting the location of the present tap by a desired number of samples back in time to virtually create non-causal inverse models which work on past, present and future input samples.

16. A method as defined in claim 15, further comprising providing a sample-by-sample lookup table value optimization.

17. A method as defined in claim 16, further comprising modifying a lookup table Volterra tap location value by reading its current value, modifying it with a processed error, and writing the new value to the same lookup table location.

18. A method as defined in claim 11, further comprising creating main X-terms by connecting Volterra tap inputs to different outputs from the tap-delay line.

19. A method as defined in claim 11, further comprising holding a history of the evolution of the input in the tap delay line such that different polynomials may be applied across time.

20. A method as defined in claim 11, further comprising using at least two Volterra taps for a sample to provide main X-terms for the sample.

* * * * *